(12) United States Patent
Kikuchi et al.

(10) Patent No.: US 10,714,243 B2
(45) Date of Patent: Jul. 14, 2020

(54) VARIABLE RESISTANCE CIRCUIT, OSCILLATOR CIRCUIT, AND SEMICONDUCTOR DEVICE

(71) Applicant: SEIKO EPSON CORPORATION, Tokyo (JP)

(72) Inventors: Takahiro Kikuchi, Kai (JP); Toshikazu Kuwano, Fujimi-machi (JP); Sachiyuki Abe, Hara-mura (JP); Shuji Kawaguchi, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/284,678

(22) Filed: Feb. 25, 2019

(65) Prior Publication Data
US 2019/0267972 A1    Aug. 29, 2019

(30) Foreign Application Priority Data
Feb. 26, 2018  (JP) ................................. 2018-031636

(51) Int. Cl.
*H01C 10/50*    (2006.01)
*H03K 3/0231*   (2006.01)
(Continued)

(52) U.S. Cl.
CPC ............ *H01C 10/50* (2013.01); *G05F 1/561* (2013.01); *H01C 1/16* (2013.01); *H01C 10/06* (2013.01);
(Continued)

(58) Field of Classification Search
CPC ...... H03K 3/03; H03K 3/0315; H03K 3/0231; H03K 4/50; H03K 4/501; H03K 4/502;
(Continued)

(56) References Cited

U.S. PATENT DOCUMENTS 6,329,860 B1    12/2001  Komatsu
8,570,139 B2 *  10/2013  Lee ........................ H01C 10/16
                                              330/144
(Continued)

FOREIGN PATENT DOCUMENTS

JP    2000-341119 A    12/2000
JP    2007-036151 A     2/2007
(Continued)

*Primary Examiner* — Ryan Johnson
(74) *Attorney, Agent, or Firm* — Oliff PLC (57) ABSTRACT

Provided is a variable resistance circuit in which the resistance value of the variable resistance circuit can be accurately adjusted, by reducing the error in the change amount of the resistance value of the variable resistance circuit due to the on-resistances of switch circuits even if the switch circuits that each bypass a resistor included in a ladder resistor circuit are switched between an OFF state and an ON state. This variable resistance circuit includes: a ladder resistor circuit including a plurality of resistors; a first switch circuit connected in series to one end of one resistor of the plurality of resistors; and a second switch circuit connected in parallel to a series circuit of the one resistor and the first switch circuit. When one of the first and second switch circuits is turned on, the other of the first and second switch circuits is turned off.

12 Claims, 8 Drawing Sheets

(51) Int. Cl.
*G05F 1/56* (2006.01)
*H01C 1/16* (2006.01)
*H03L 7/02* (2006.01)
*H03K 3/011* (2006.01)
*H01C 10/06* (2006.01)
*H01C 10/16* (2006.01)
*H03K 4/501* (2006.01)
*H03K 3/03* (2006.01)

(52) U.S. Cl.
CPC .............. *H01C 10/16* (2013.01); *H03K 3/011* (2013.01); *H03K 3/0231* (2013.01); *H03K 3/03* (2013.01); *H03K 4/501* (2013.01); *H03L 7/02* (2013.01)

(58) Field of Classification Search
CPC ........ H03K 3/011; H01C 10/50; H01C 10/06; H01C 10/16; H01C 1/16
See application file for complete search history.

(56) References Cited

U.S. PATENT DOCUMENTS

| | | | |
|---|---|---|---|
| 9,046,910 B2* | 6/2015 | Sako | ............ G05F 1/561 |
| 9,503,058 B1* | 11/2016 | Cical | ............ H03L 7/00 |
| 2011/0304376 A1 | 12/2011 | Utsunomiya | |
| 2012/0092078 A1 | 4/2012 | Kai | |
| 2012/0182065 A1 | 7/2012 | Sano | |
| 2019/0199287 A1 | 6/2019 | Kuwano et al. | |

FOREIGN PATENT DOCUMENTS

| | | |
|---|---|---|
| JP | 2011-258827 A | 12/2011 |
| JP | 2012-085163 A | 4/2012 |
| JP | 2012-151186 A | 8/2012 |
| JP | 2019-118006 | 7/2019 |

* cited by examiner

VARIABLE RESISTANCE CIRCUIT, OSCILLATOR CIRCUIT, AND SEMICONDUCTOR DEVICE

BACKGROUND

This application claims the benefit of priority from Japanese Patent Application No. 2018-031636 filed Feb. 26, 2018, the entire contents of which are incorporated herein by reference.

1. Technical Field

The present invention relates to a variable resistance circuit whose resistance value can be changed according to a control signal. Furthermore, the invention relates to an oscillator circuit that uses such a variable resistance circuit, a semiconductor device that includes such a variable resistance circuit, and the like.

2. Related Art

A semiconductor device such as a microcomputer includes an oscillator circuit that supplies a clock signal to a CPU (Central Processing Unit) and peripheral circuits. For example, in the case of a CR oscillator circuit, the oscillation frequency can be matched with a target frequency by adjusting the resistance value of a resistor that constitutes the oscillator circuit. In this case, a variable resistance circuit whose resistance value can be changed according to a control signal is used.

In a known variable resistance circuit, a plurality of switch circuits are respectively connected in parallel to a plurality of resistors that constitute a ladder resistor circuit, for example. As a result of controlling each switch circuit to an OFF state or an ON state, the resistance value of the variable resistance circuit can be adjusted by switching the element through which a current supplied to the variable resistance circuit flows between the resistor and the switch circuit.

A clock oscillator circuit that automatically adjusts the oscillation frequency through trimming with reference to a clock that is accurate at a low speed is disclosed in JP-A-2000-341119 (Paragraphs 0007-0008 and 0027-0028, FIGS. 1 and 3), as a related technology. This clock oscillator circuit includes an oscillator that outputs a clock whose oscillation frequency changes according to the value of a parameter, a frequency measurement circuit that measures the oscillation frequency of the oscillator with reference to a calibration clock, and a trimming control circuit that trims the parameter using a binary search according to the measured oscillation frequency.

With reference to FIG. 1 in JP-A-2000-341119, the clock oscillator circuit oscillates at a frequency that is in inverse proportion to the product of the resistance value of a resistor 2 and the capacitance value of a capacitor 3 by repeating charging and discharging of the capacitor 3, and outputs a clock pulse to a clock terminal. Also, with reference to FIG. 3, inputs of a switch array 8 are respectively connected to gates of N+1 P-channel transistors, and the drain and source of each P-channel transistor are respectively connected to two ends of the corresponding resistor having a resistance value of R multiplied to the power of 2 in the resistor 2. Here, the resistor 2 and the switch array 8 constitute a variable resistance circuit, and the N+1 P-channel transistors in the switch array 8 correspond to a plurality of switch circuits that are respectively connected in parallel to the plurality of resistors included in the resistor 2, which is a ladder resistor circuit.

When the resistance value of such a variable resistance circuit is adjusted, the number of switch circuits that are controlled to be turned on in order to bypass resistors included in the ladder resistor circuit is changed, and as a result, the total value of on-resistances of switch circuits included in the current path of the variable resistance circuit is changed. Accordingly, the change amount of resistance value due to selection/non-selection of resistors included in the ladder resistor circuit is influenced by an unintended change in the total on-resistance of the switch circuits, and as a result, an error from the desired change amount of the resistance value occurs. As a result, sufficient adjustment of the oscillation frequency is not possible in a CR oscillator circuit for which accuracy needs to be high.

SUMMARY

An advantage of some aspects of the invention is to accurately adjust the resistance value of a variable resistance circuit, when the resistance value of the variable resistance circuit is adjusted, by reducing the error in the change amount of the resistance value of the variable resistance circuit due to the on-resistances of switch circuits even if the switch circuits that each bypass a resistor included in a ladder resistor circuit are switched between an OFF state and an ON state. Also, another advantage of some aspects of the invention is to provide an oscillator circuit that uses such a variable resistance circuit. Furthermore, another advantage of some aspects of the invention is to provide a semiconductor device including such a variable resistance circuit.

A variable resistance circuit according to a first aspect of the invention includes: a ladder resistor circuit including a plurality of resistors; a first switch circuit connected in series to one end of one resistor of the plurality of resistors; and a second switch circuit connected in parallel to a series circuit of the one resistor and the first switch circuit. When one of the first and second switch circuits is turned on, the other of the first and second switch circuits is turned off.

According to the first aspect of the invention, when the second switch circuit is turned off, the first switch circuit is turned on and is included in the current path of the variable resistance circuit along with a resistor. On the other hand, when the second switch circuit is turned on and is included in the current path of the variable resistance circuit, the first switch circuit is turned off. Therefore, even if the second switch circuit for bypassing a resistor included in the ladder resistor circuit is switched between an OFF state and an ON state, the error in the change amount of the resistance value of the variable resistance circuit due to the on-resistance of the second switch circuit can be reduced, and the resistance value of the variable resistance circuit can be accurately adjusted.

Here, the variable resistance circuit includes a plurality of the first switch circuits and a plurality of the second switch circuits, and the number of the plurality of first switch circuits may be the same as the number of the plurality of second switch circuits. With this, a configuration can be realized in which, even if the current path of the variable resistance circuit is switched, the number of switch circuits included in the current path is the same, and the total value of the on-resistances is approximately the same, and as a result, the change amount of the resistance value of the variable resistance circuit is mainly determined by the selection/unselection of the resistors in the ladder resistor circuit.

Alternatively, the variable resistance circuit further includes a third switch circuit connected in parallel to a resistor, of the plurality of resistors, that is not connected to the first switch circuit. As a result of providing the third switch circuit instead of the first and second switch circuits in some units in the variable resistance circuit, the number of switch circuits in the variable resistance circuit can be reduced, and the circuit area can be reduced.

In this case, the first switch circuit, the second switch circuit, and the third switch circuit may each include the same number of switch elements. Furthermore, the first switch circuit, the second switch circuit, and the third switch circuit may each desirably have the same on-resistance.

Accordingly, a configuration can be realized in which, in a unit in which the first and second switch circuits are provided, the on-resistance of the switch circuit included in the current path of the variable resistance circuit does not noticeably change regardless of whether the first switch circuit is turned on or the second switch circuit is turned on. Also, if the resistance value of a resistor in a unit in which the third switch circuit is provided is larger than the resistance value of a resistor in another unit, the error in the change rate of the resistance value of the variable resistance circuit due to the on-resistance of the third switch circuit can be suppressed to a certain range.

An oscillator circuit according to a second aspect of the invention includes: a charging and discharging type oscillator configured to perform an oscillation operation at an oscillation frequency according to the amount of a control current, and a control current generation unit that includes any of the variable resistance circuits described above, and is configured to generate the control current based on an output voltage of a temperature sensor, using a resistance value, of the variable resistance circuit, that is set by a control signal.

According to the second aspect of the invention, after the resistance value of the variable resistance circuit has been set by the control signal, the control current is generated based on the output voltage of the temperature sensor using the resistance value. Therefore, since the oscillation frequency of the oscillator circuit is controlled by the control current, an oscillator circuit can be provided whose oscillation frequency is continuously temperature-compensated according to the change in temperature without switching the resistance element or the capacitance element that is used in the oscillation operation, and in which noise, jitter, or the like is reduced.

A semiconductor device according to a third aspect of the invention includes any of the variable resistance circuits described above. According to the third aspect of the invention, a semiconductor device can be provided in which, even if the second switch circuit for bypassing a resistor included in the ladder resistor circuit is switched between an OFF state and an ON state, the error in the change amount of the resistance value of the variable resistance circuit due to the on-resistance of the second switch circuit can be reduced, and the resistance value of the variable resistance circuit can be accurately adjusted.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. The same constituent elements are given the same reference numerals, and a redundant description is omitted.

Semiconductor Device

Figure 1:
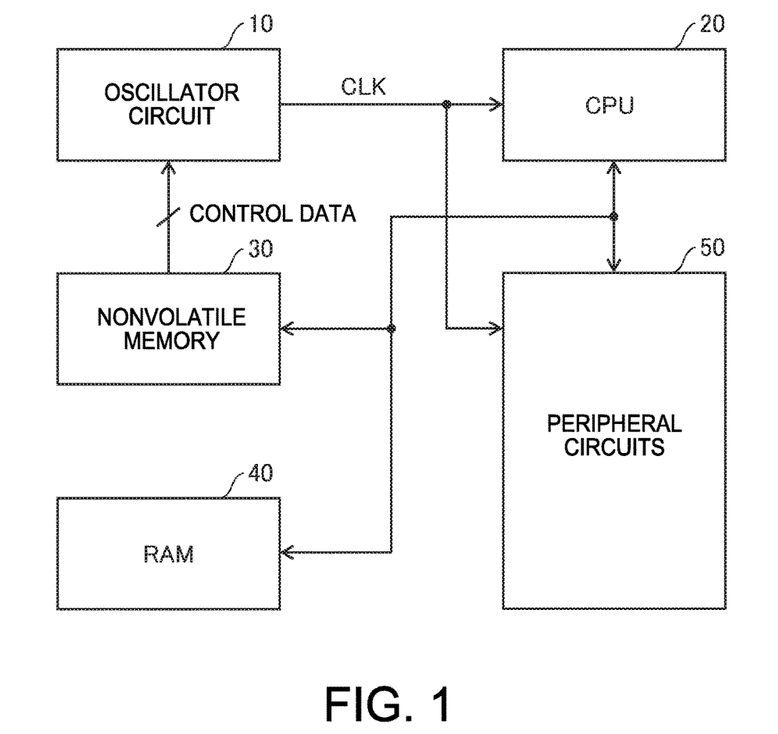
FIG. 1 is a block diagram illustrating an exemplary configuration of a semiconductor device according to one embodiment of the invention.

FIG. 1 is a block diagram illustrating an exemplary configuration of a semiconductor device according to one embodiment of the invention. The semiconductor device includes a variable resistance circuit according to one embodiment of the invention. In FIG. 1, a microcomputer including an oscillator circuit 10, a CPU 20, a nonvolatile memory 30, a RAM (Random Access Memory) 40, and a peripheral circuit 50 is shown as an example of the semiconductor device.

The oscillator circuit 10 generates a clock signal CLK having a predetermined frequency by performing an oscillation operation, and supplies the clock signal CLK to the CPU 20 and the peripheral circuit 50. The CPU 20 operates in synchronization with the clock signal CLK supplied from the oscillator circuit 10, and performs various types of signal processing and control processing according to programs. The nonvolatile memory 30 stores programs, data, and the like for the CPU 20 to perform the various types of signal processing and control processing.

Also, the nonvolatile memory 30 stores control data including first and second control signals that are used to adjust the oscillation frequency of the oscillator circuit 10, and supplies the control data to the oscillator circuit 10. Note that a plurality of fuses may be provided separate from the nonvolatile memory 30 in order to store the control data. The RAM 40 is used as a work area of the CPU 20, and temporarily stores programs and data that have been read out from the nonvolatile memory 30, or results of computation and the like performed by the CPU 20 according to programs.

Oscillator Circuit

Figure 2:
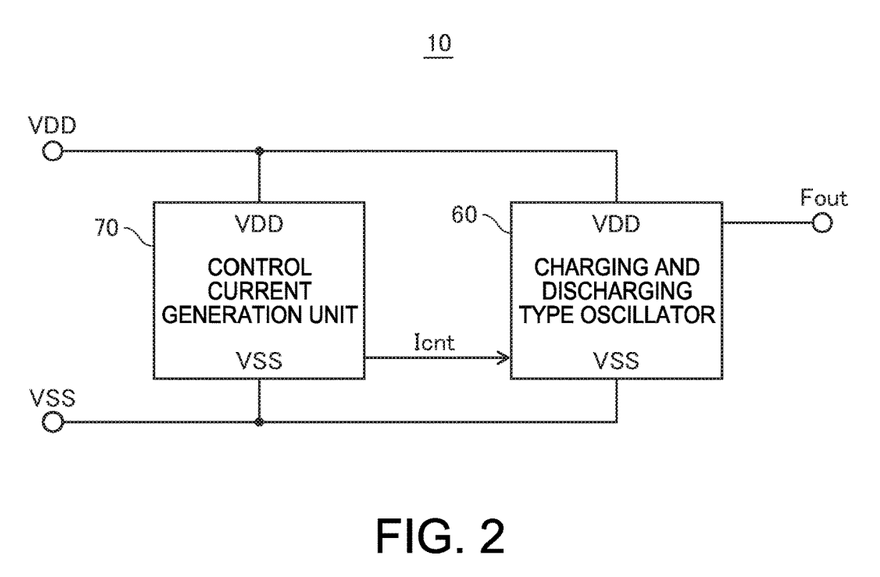
FIG. 2 is a circuit diagram illustrating an exemplary configuration of an oscillator circuit shown in FIG. 1.

FIG. 2 is a circuit diagram illustrating an exemplary configuration of the oscillator circuit shown in FIG. 1. As shown in FIG. 2, the oscillator circuit 10 according to one embodiment of the invention includes a charging and discharging type oscillator 60 and a control current generation unit 70, and operates by being supplied with a high-potential side power supply potential VDD and a low-potential side power supply potential VSS from a regulator or the like. In the present embodiment, the power supply potential VSS is assumed to be ground potential (0V).

The charging and discharging type oscillator 60 generates an oscillation signal Fout by performing an oscillation operation at an oscillation frequency according to the amount of a control current Icnt. The oscillation signal Fout is used as the clock signal CLK shown in FIG. 1. The control current generation unit 70 includes a variable resistance circuit according to one embodiment of the invention, and generates the control current Icnt based on an output voltage of a temperature sensor using the resistance value of the variable resistance circuit that is set based on the control signals.

Charging and Discharging Type Oscillator

Figure 3:
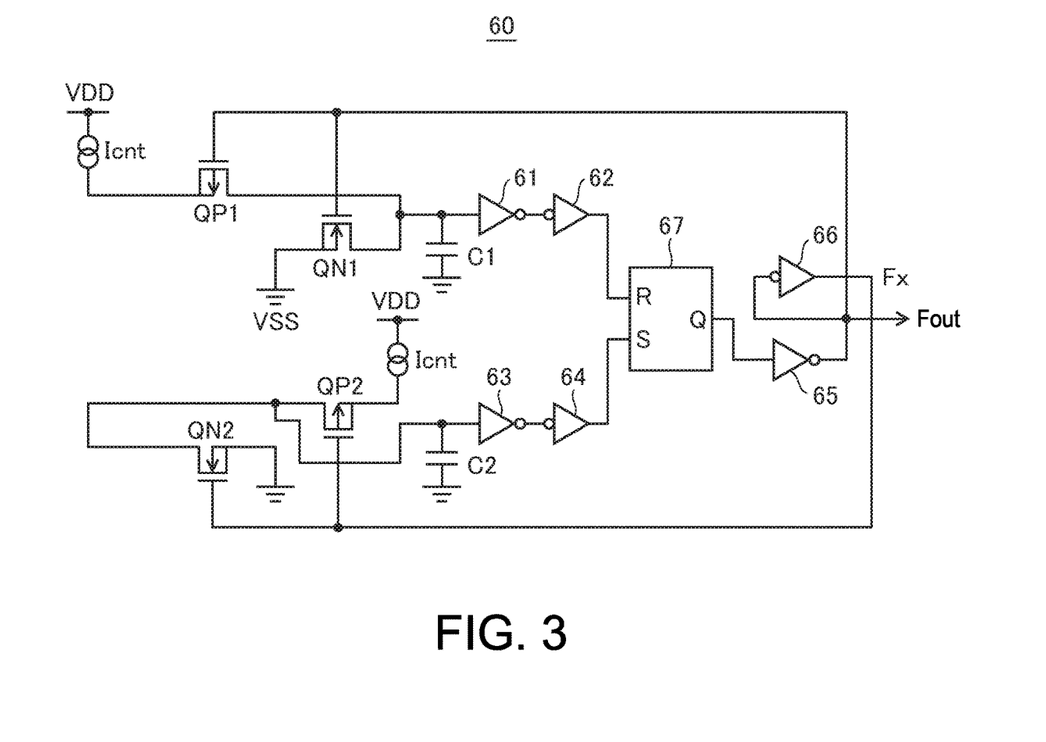
FIG. 3 is a circuit diagram illustrating an exemplary configuration of a charging and discharging type oscillator shown in FIG. 2.

FIG. 3 is a circuit diagram illustrating an exemplary configuration of the charging and discharging type oscillator shown in FIG. 2. As shown in FIG. 3, the charging and discharging type oscillator 60 includes P-channel MOS (metal oxide semiconductor) transistors QP1 and QP2, N-channel MOS transistors QN1 and QN2, capacitors C1 and C2, inverters 61 to 66, and an RS flip-flop (RS latch) 67. The inverter 65 generates the oscillation signal Fout by inverting an output signal output from an output terminal Q of the RS flip-flop 67, and the inverter 66 generates an inverted oscillation signal Fx by further inverting the oscillation signal Fout.

The control current Icnt supplied to the charging and discharging type oscillator 60 is supplied to a source of the transistor QP1 and a source of the transistor QP2 by current mirror circuits or the like. The transistor QP1 has a gate to which the oscillation signal Fout is supplied. The transistor QN1 has a drain connected to a drain of the transistor QP1, a source connected to an interconnect of the power supply potential VSS, and a gate to which the oscillation signal Fout is applied.

One end of the capacitor C1 is connected to the drain of the transistor QP1 and the drain of the transistor QN1, and the other end is connected to the interconnect of the power supply potential VSS. The signal generated at the one end of the capacitor C1 is buffered by the inverters 61 and 62, and then supplied to a reset terminal R of the RS flip-flop 67 as a reset signal.

The transistor QP2 has a gate to which the inverted oscillation signal Fx is applied. The transistor QN2 has a drain connected to a drain of the transistor QP2, a source connected to the interconnect of the power supply potential VSS, and a gate to which the inverted oscillation signal Fx is applied.

One end of the capacitor C2 is connected to the drain of the transistor QP2 and the drain of the transistor QN2, and the other end is connected to the interconnect of the power supply potential VSS. The signal generated at the one end of the capacitor C2 is buffered by the inverters 63 and 64, and then supplied to a set terminal S of the RS flip-flop 67 as a set signal.

The RS flip-flop 67 is set, when the reset signal is at a low level, at a timing when the set signal rises, and activates the output signal to a high level, and is reset, when the set signal is at a low level, at a timing when the reset signal rises, and deactivates the output signal to a low level.

When the RS flip-flop 67 is reset, the oscillation signal Fout is changed to a high level, and the inverted oscillation signal Fx is changed to a low level. Accordingly, the transistor QP1 is turned off and the transistor QN1 is turned on, and therefore charges accumulated in the capacitor C1 are discharged, and the reset signal is changed to a low level.

Meanwhile, the transistor QP2 is turned on and the transistor QN2 is turned off, and therefore the control current Icnt flows to the capacitor C2, the capacitor C2 is charged, and the set signal is changed to a high level. With this, the RS flip-flop 67 is set, and the output signal is activated to a high level.

When the RS flip-flop 67 is set, the oscillation signal Fout is changed to a low level and the inverted oscillation signal Fx is changed to a high level. Therefore, the transistor QP2 is turned off and the transistor QN2 is turned on, and as a result, charges accumulated in the capacitor C2 are discharged and the set signal is changed to a low level.

Meanwhile, the transistor QP1 is turned on and the transistor QN1 is turned off, the control current Icnt flows to the capacitor C1, the capacitor C1 is charged, and the reset signal is changed to a high level. With this, the RS flip-flop 67 is reset, and the output signal is deactivated to a low level.

As a result of the RS flip-flop 67 being repeatedly set and reset, the charging and discharging type oscillator 60 performs a highly accurate oscillation operation. The speed at which the RS flip-flop 67 is repeatedly set and reset is approximately proportional to the amount of the control current Icnt, and therefore the oscillation frequency of the charging and discharging type oscillator 60 can be controlled by the amount of the control current Icnt.

Control Current Generation Unit

Figure 4:
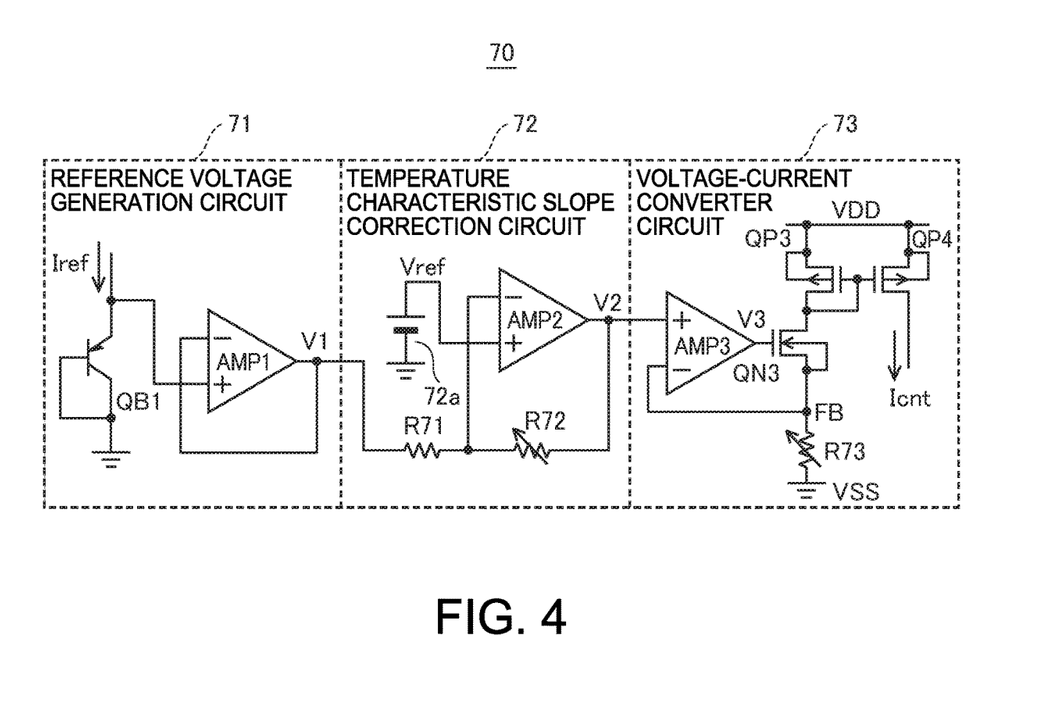
FIG. 4 is a circuit diagram illustrating an exemplary configuration of a control current generation unit shown in FIG. 2.

FIG. 4 is a circuit diagram illustrating an exemplary configuration of the control current generation unit shown in FIG. 2. As shown in FIG. 4, the control current generation unit 70 includes a reference voltage generation circuit 71, a temperature characteristic slope correction circuit 72, and a voltage-current converter circuit 73.

Reference Voltage Generation Circuit

The reference voltage generation circuit 71 includes a PNP bipolar transistor QB1 and a differential amplifier circuit AMP1, for example, and generates a reference voltage V1 having a first temperature characteristic. The transistor QB1 has an emitter to which a constant current Iref is supplied, and a collector and a base that are connected to an interconnect of the power supply potential VSS. Since the base of the transistor QB1 is connected to the collector, the transistor QB1 is equivalent to a diode.

The differential amplifier circuit AMP1 includes a non-inverting input terminal connected to the emitter of the transistor QB1, and an inverting input terminal connected to an output terminal, and functions as a voltage follower that buffers the voltage applied to the non-inverting input terminal, and outputs the voltage from the output terminal. Therefore, the reference voltage generation circuit 71 generates the reference voltage V1 based on the voltage between the emitter, and the base and collector, of the transistor QB1. With this, a temperature sensor is constituted by a bipolar transistor, and the reference voltage V1 having a first temperature characteristic can be generated based on the output voltage of the temperature sensor.

Figure 5:
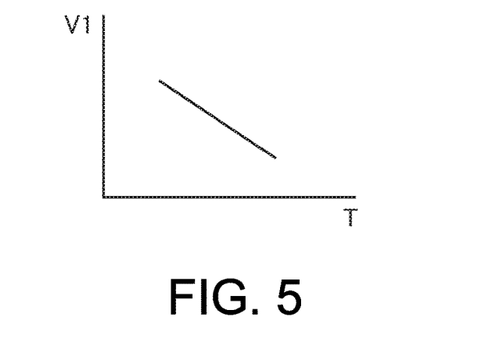
FIG. 5 is a diagram illustrating a temperature characteristic of a reference voltage generated by a reference voltage generation circuit.

FIG. 5 is a diagram schematically illustrating the temperature characteristic of the reference voltage generated by the reference voltage generation circuit shown in FIG. 4. In FIG. 5, the horizontal axis shows the temperature T, and the vertical axis shows the reference voltage V1 generated by the reference voltage generation circuit 71. In the example shown in FIG. 5, the reference voltage V1 decreases as the temperature T increases.

When the constant current Iref has an extremely low temperature dependency, the temperature characteristic of the reference voltage V1 is mainly determined by the temperature characteristic of the transistor QB1. However, because the temperature characteristic of the control current Icnt that is ultimately output from the control current generation unit 70 is adjustable, the temperature dependency of the constant current Iref has a predetermined allowable range.

Temperature Characteristic Slope Correction Circuit

The temperature characteristic slope correction circuit 72 includes a constant voltage generation circuit 72a, a differential amplifier circuit AMP2, and resistors R71 and R72, for example, corrects the slope of the temperature characteristic of the reference voltage V1 according to the first control signal included in the control data shown in FIG. 1, and generates an output voltage V2 having a second temperature characteristic.

The constant voltage generation circuit 72a is constituted by a bandgap reference circuit or the like, for example, and generates a constant voltage Vref. Although the constant voltage Vref desirably has an extremely low temperature dependency, because the temperature characteristic of the control current Icnt that is ultimately output from the control current generation unit 70 is adjustable, the temperature dependency of the constant voltage Vref has a predetermined allowable range.

The differential amplifier circuit AMP2 has a non-inverting input terminal to which the constant voltage Vref is applied, and an inverting input terminal that is connected to the output terminal of the reference voltage generation circuit 71 via the resistor R71 and is also connected to an output terminal of the differential amplifier circuit AMP2 via the resistor R72, and outputs an output voltage V2 from the output terminal by amplifying the reference voltage V1 using the constant voltage Vref as a reference.

Here, at least one of the resistors R71 and R72 (resistor R72, in FIG. 4) is a variable resistance circuit that is used to adjust the amplification factor (closed loop gain) of the differential amplifier circuit AMP2, and has a resistance value that is set according to the first control signal. The temperature characteristic slope correction circuit 72 can correct the slope of the temperature characteristic of the reference voltage V1 to a desired slope based on the resistance value of the resistor R72 (or R71).

The output voltage V2 of the differential amplifier circuit AMP2 is obtained as in equation (1) assuming that the open loop gain of the differential amplifier circuit AMP2 is sufficiently large.

$$V2-Vref=-(R72/R71)\times(V1-Vref) \therefore V2=Vref-(R72/R71)\times(V1-Vref) \quad (1)$$

Figure 6:
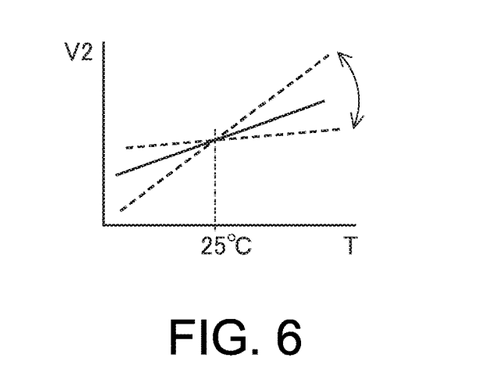
FIG. 6 is a diagram illustrating a temperature characteristic of an output voltage of a temperature characteristic slope correction circuit.

FIG. 6 is a diagram schematically illustrating a temperature characteristic of the output voltage of the temperature characteristic slope correction circuit shown in FIG. 4. In FIG. 6, the horizontal axis shows the temperature T, and the vertical axis shows the output voltage V2 of the temperature characteristic slope correction circuit 72. In the example shown in FIG. 6, the output voltage V2 increases as the temperature T increases.

From equation (1), as a result of configuring the control current generation unit 70 such that the reference voltage V1 is equal to the constant voltage Vref at a given temperature (25° C., for example), the slope of the temperature characteristic of the output voltage V2 of the differential amplifier circuit AMP2 can be changed without causing the output voltage V2 of the differential amplifier circuit AMP2 at the given temperature to change.

Voltage-Current Converter Circuit

The voltage-current converter circuit 73 includes a differential amplifier circuit AMP3, an N-channel MOS transistor QN3, P-channel MOS transistors QP3 and QP4, and a resistor R73, for example, converts the output voltage V2 of the temperature characteristic slope correction circuit 72 to the control current Icnt, and adjusts the amount of the control current Icnt according to the second control signal included in the control data shown in FIG. 1.

The differential amplifier circuit AMP3 includes a non-inverting input terminal to which the output voltage V2 of the temperature characteristic slope correction circuit 72 is applied, and an inverting input terminal to which a feedback voltage FB is applied, and outputs an output voltage V3 from an output terminal. The transistor QN3 has a gate to which the output voltage V3 of the differential amplifier circuit AMP3 is applied, and a source connected to the interconnect of the power supply potential VSS via the resistor R73.

The transistors QP3 and QP4 constitute a current mirror circuit. The transistor QP3 has a source connected to an interconnect of the power supply potential VDD, and a drain and a gate that are connected to a drain of the transistor QN3. The transistor QP4 has a source connected to the interconnect of the power supply potential VDD, and a gate connected to the drain and gate of the transistor QP3. A current proportional to the current flowing through the transistor QP3 flows through the transistor QP4, and as a result, the control current Icnt is output from the drain of the transistor QP4.

Here, the transistor QN3 controls the amount of current that flows through the transistor QP3 according to the output voltage V2 of the temperature characteristic slope correction circuit 72. When a current flows through the transistor QN3, the feedback voltage FB is generated at one end of the resistor R73. Since the feedback voltage FB is applied to the inverting input terminal of the differential amplifier circuit AMP3, the feedback voltage FB becomes equal to the output voltage V2 of the temperature characteristic slope correction circuit 72 that is applied to the non-inverting input terminal.

Therefore, the control current Icnt is expressed by equation (2) using a current I3 flowing through the transistor QN3.

$$Icnt=\alpha I3=\alpha V2/R73 \quad (2)$$

Here, α is a proportional constant that is determined by the size ratio between the transistors QP3 and QP4 that constitute the current mirror circuit.

The resistor R73 is a variable resistance circuit used to adjust the voltage-current conversion rate of the transistor QN3, and has a resistance value that is set according to the second control signal. The voltage-current converter circuit 73 adjusts the amount of control current Icnt that is output from the transistor QP4 based on the resistance value of the resistor R73. With this, the oscillation frequency at a given temperature can be set to a desired frequency.

Figure 7:
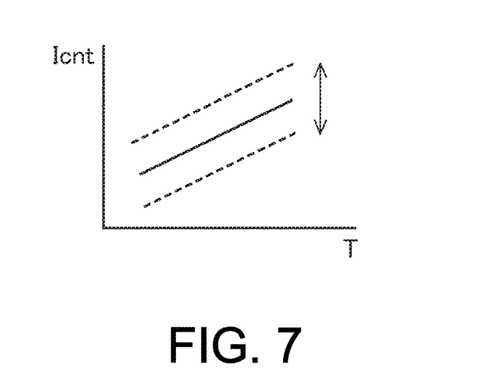
FIG. 7 is a diagram illustrating a temperature characteristic of a control current generated by a voltage-current converter circuit.

FIG. 7 is a diagram schematically illustrating a temperature characteristic of the control current generated by the voltage-current converter circuit shown in FIG. 4. In FIG. 7, the horizontal axis shows the temperature T, and the vertical axis shows the control current Icnt generated by the voltage-current converter circuit 73. In the example shown in FIG. 7, the control current Icnt increases as the temperature T increases.

Adjustment of Oscillation Frequency

With reference to FIGS. 4 to 7, in order to adjust the oscillation frequency of the oscillator circuit, first, the amount of control current Icnt is adjusted (FIG. 7) by adjusting the resistance value of the resistor R73 in the voltage-current converter circuit 73 so that the oscillation frequency at a given temperature (25° C., for example) matches the target value. Next, the temperature characteristic of the output voltage V2 is adjusted (FIG. 6) by adjusting the resistance value of the resistor R72 (or R71) in the temperature characteristic slope correction circuit 72 so that the frequency error at a high temperature (85° C., for example) or a low temperature (−40° C., for example) decreases.

Upon these resistance values being determined, the first and second control signals for setting these resistance values are stored in the nonvolatile memory 30 (or fuses) shown in FIG. 1 as the control data, and the first and second control signals are automatically read out when the oscillator circuit is started up, and are used. In this way, as a result of storing the control data corresponding to each oscillator circuit in the storage, the characteristics of each oscillator circuit can be improved.

Figure 8:
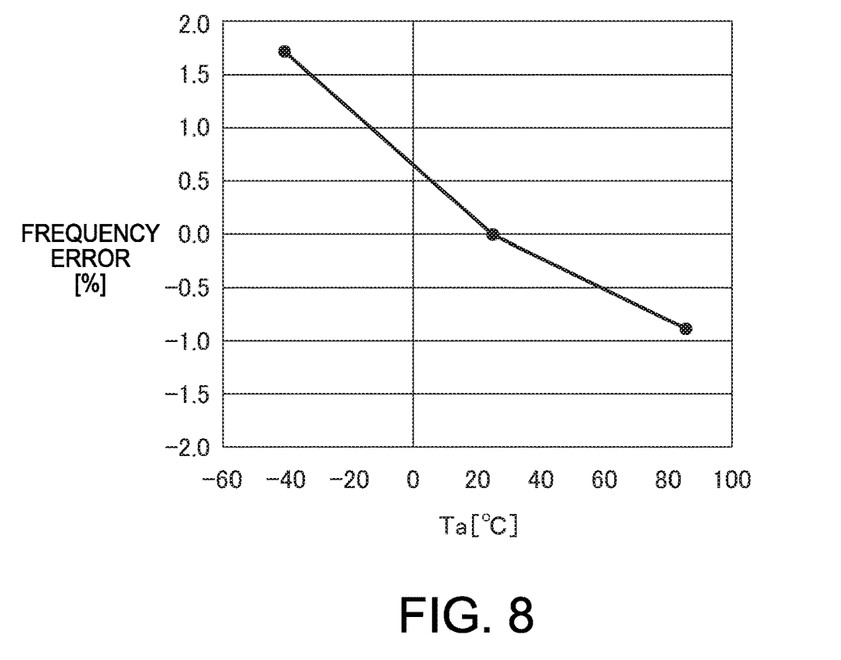
FIG. 8 is a diagram illustrating a frequency error in a state in which the temperature characteristic of the oscillator circuit is not compensated.
Figure 9:
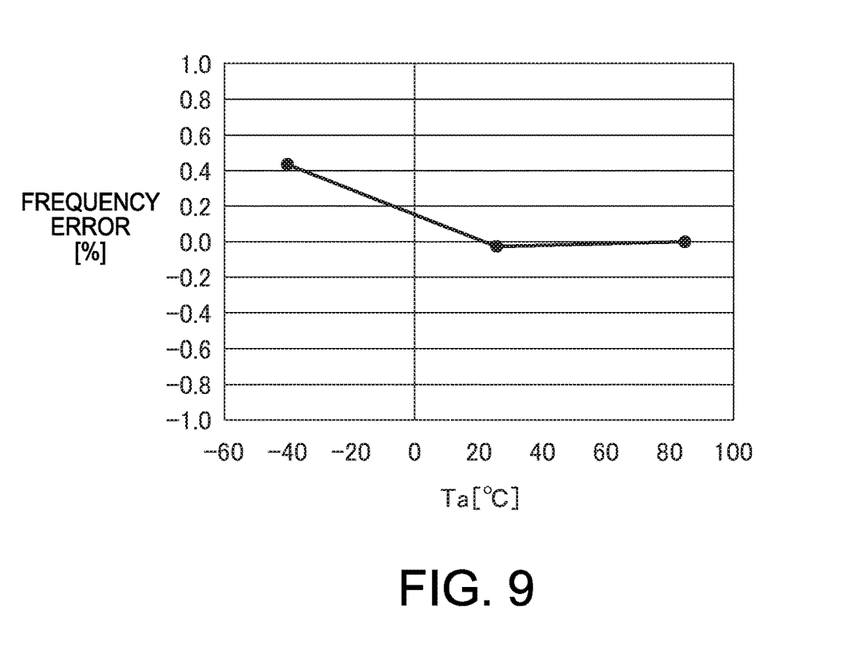
FIG. 9 is a diagram illustrating a frequency error in a state in which the temperature characteristic of the oscillator circuit is compensated.

FIG. 8 is a diagram illustrating an exemplary frequency error in a state in which the temperature characteristic of the oscillator circuit is not compensated. FIG. 9 is a diagram illustrating an exemplary frequency error in a state in which the temperature characteristic of the oscillator circuit is compensated. In FIGS. 8 and 9, the horizontal axis shows the environmental temperature Ta [° C.] around the oscillator circuit, and the vertical axis shows measured values of the frequency error [%].

In a state in which the temperature characteristic of the oscillator circuit is not compensated, the control current Icnt supplied to the charging and discharging type oscillator 60 shown in FIG. 2 is made constant regardless of the temperature. In this case, the charging and discharging type oscillator 60 has a temperature dependency in which the oscillation frequency decreases as the environmental temperature Ta increases, as shown in FIG. 8. On the other hand, when the control current Icnt is made to have an appropriate temperature characteristic by the control current generation unit 70 shown in FIG. 2, the temperature dependency of the oscillation frequency of the charging and discharging type oscillator 60 is suppressed by making use of the temperature characteristic of the control current Icnt, as shown in FIG. 9.

Also, there are cases where the charging and discharging type oscillator 60 shown in FIG. 2 has a temperature dependency in which the oscillation frequency increases as the environmental temperature Ta increases in a state in which the temperature characteristic of the oscillator circuit is not compensated. In such a case, an NPN bipolar transistor may be used instead of the PNP bipolar transistor in the reference voltage generation circuit 71 shown in FIG. 4. The NPN bipolar transistor is connected on the power supply potential VDD side.

Furthermore, a configuration may be adopted in which both the PNP bipolar transistor and NPN bipolar transistor are included in the reference voltage generation circuit 71, and switching is performed to use one of them. Alternatively, an inverting amplifier circuit may be added to the temperature characteristic slope correction circuit 72 shown in FIG. 4, or the differential amplifier circuit AMP2 may perform a non-inverting amplification operation.

There is a risk that noise, jitter, or the like will increase when a resistance element or a capacitance element that is used in the oscillation operation performed by the oscillator circuit is switched in accordance with a change in temperature. According to the present embodiment, after the resistance value of the variable resistance circuit has been set by the control signals, the control current is generated based on the output voltage of a temperature sensor using the set resistance value. Therefore, since the oscillation frequency of the oscillator circuit is controlled by the control current, it is possible to provide an oscillator circuit whose oscillation frequency is continuously temperature-compensated according to a change in temperature without switching the resistance element or the capacitance element that is used in the oscillation operation, and in which noise, jitter, or the like is reduced.

Variable Resistance Circuit

Next, a variable resistance circuit that can be used as the resistor R71 or R72 in the temperature characteristic slope correction circuit 72 shown in FIG. 4, and the resistor R73 in the voltage-current converter circuit 73 will be described while being compared with a comparative example.

Figure 10:
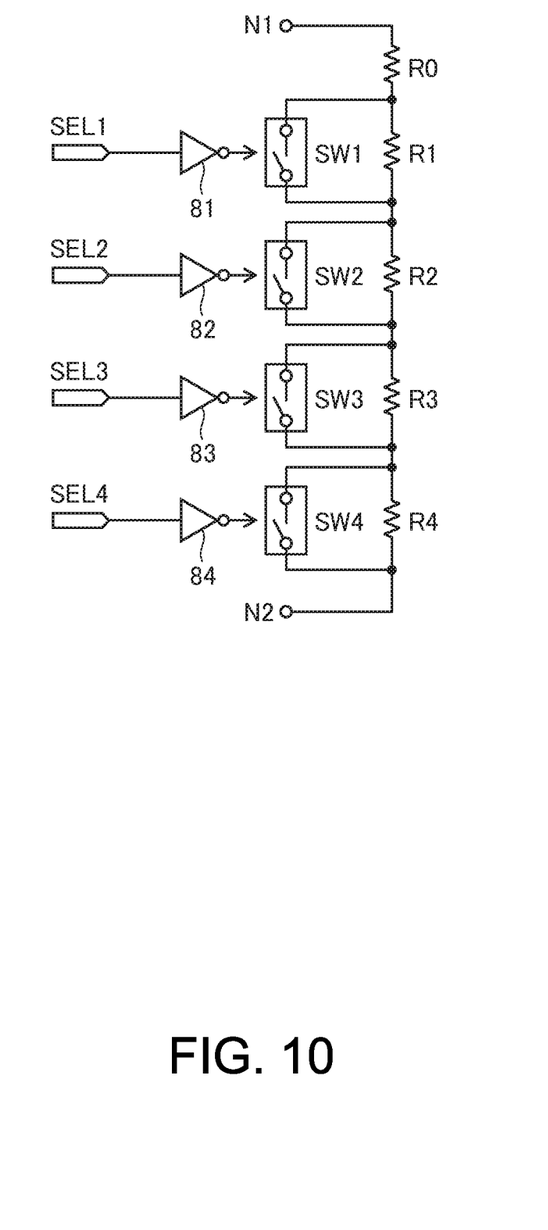
FIG. 10 is a circuit diagram illustrating a configuration of a variable resistance circuit according to a comparative example.
Figure 11:
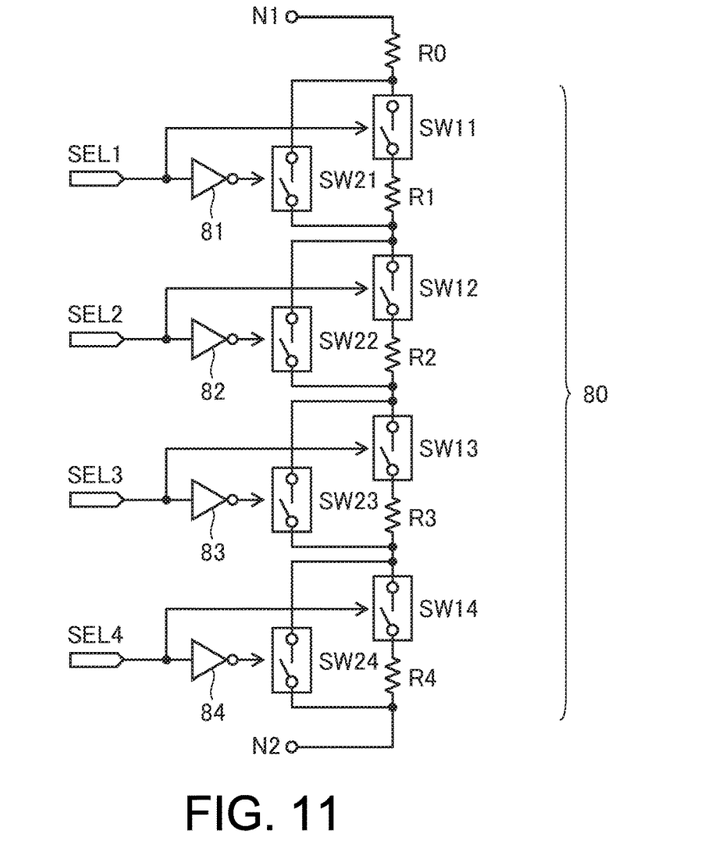
FIG. 11 is a circuit diagram illustrating an exemplary configuration of a variable resistance circuit according to one embodiment of the invention.

FIG. 10 is a circuit diagram illustrating a configuration of a variable resistance circuit according to a comparative example. FIG. 11 is a circuit diagram illustrating an exemplary configuration of the variable resistance circuit according to one embodiment of the invention. In the following, a case where the resistance value of the variable resistance circuit is controlled by four one-bit control signals SEL1 to SEL4 will be described, as an example.

A variable resistance circuit 80 (FIG. 11) includes a ladder resistor circuit including a plurality of adjustment resistors (hereinafter, simply referred to as "resistors") R1 to R4 connected in series to a basic resistor R0, between a node N1 and a node N2. For example, an $i^{th}$ resistor R1 has a resistance value of $2^{(i-1)} \times R$. In this case, the resistance values of the resistors R1 to R4 are respectively R, 2R, 4R, and 8R.

As shown in FIG. 10, the variable resistance circuit according to the comparative example further includes a plurality of switch circuits SW1 to SW4 that are respectively connected in parallel to the resistors R1 to R4, and inverters 81 to 84 that respectively invert the control signals SEL1 to SEL4 and supply the inverted control signals to the respective switch circuits SW1 to SW4.

In the variable resistance circuit according to the comparative example, the number of switch circuits that are controlled to be turned on in order to bypass resistors included in the ladder resistor circuit changes when the resistance value of the variable resistance circuit is adjusted, and therefore, the total value of on-resistances of switch circuits included in the current path of the variable resistance circuit also changes. Accordingly, the change amount of resistance value due to the selection/non-selection of resistors included in the ladder resistor circuit is influenced by an unintended change in the total on-resistance of switch circuits, and as a result, an error from the desired change amount of the resistance value occurs.

On the other hand, as shown in FIG. 11, the variable resistance circuit according to one embodiment of the invention 80 includes a first switch circuit (first switch circuit SW11, for example) connected in series to one end of one resistor (resistor R1, for example), of a plurality of resistors that constitute a ladder resistor circuit, a second switch circuit (second switch circuit SW21, for example) connected in parallel to a series circuit of the resistor and the first switch circuit, and an inverter (inverter 81, for example) that inverts a control signal (control signal SEL1, for example) and supplies the inverted control signal to the second switch circuit.

The resistor R1, the first switch circuit SW11, the second switch circuit SW21, and the inverter 81 constitute one unit, and the variable resistance circuit 80 may include a plurality of units connected in series. The number of units can be increased or decreased according to the required resistance value adjustable range.

Here, when one of the first and second switch circuits SW11 and SW21 is turned on, the other of the first and second switch circuits SW11 and SW21 is turned off. For example, when the control signal SEL1 for selecting the resistor R1 is activated, the first switch circuit SW11 is turned on and the second switch circuit SW21 is turned off, and the resistor R1 is included in the current path of the variable resistance circuit 80.

On the other hand, when the control signal SEL1 for selecting the resistor R1 is deactivated, the first switch circuit SW11 is turned off and the second switch circuit SW21 is turned on, the second switch circuit SW21 is included in the current path of the variable resistance circuit 80, and the resistor R1 is bypassed.

In this way, according to the present embodiment, when the second switch circuit SW21 is turned off, the first switch circuit SW11 is turned on and is included in the current path of the variable resistance circuit 80 along with the resistor R1. On the other hand, when the second switch circuit SW21 is turned on and is included in the current path of the variable resistance circuit 80, the first switch circuit SW11 is turned off.

Therefore, even if the second switch circuit SW21 for bypassing the resistor R1 included in the ladder resistor circuit is switched between an OFF state and an ON state, the error in the change amount of the resistance value of the variable resistance circuit 80 due to the on-resistance of the second switch circuit SW21 can be reduced, and the resistance value of the variable resistance circuit 80 can be accurately adjusted. Also, a semiconductor device including such a variable resistance circuit 80 can be provided.

Figure 12:
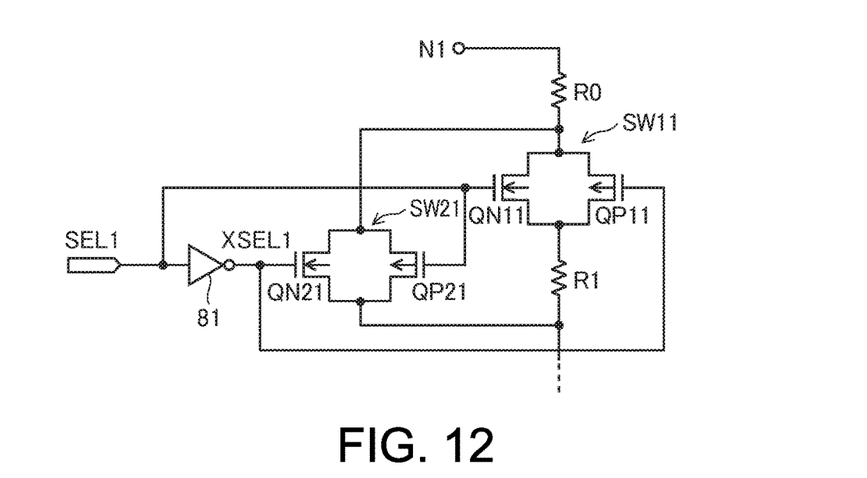
FIG. 12 is a circuit diagram illustrating a specific example of first and second switch circuits shown in FIG. 11.

FIG. 12 is a circuit diagram illustrating a specific example of the first and second switch circuits shown in FIG. 11. In the example shown in FIG. 12, the first switch circuit SW11 includes an N-channel MOS transistor QN11 and a P-channel MOS transistor QP11, as switch elements, and the second switch circuit SW21 includes an N-channel MOS transistor QN21 and a P-channel MOS transistor QP21, as switch elements.

Although any number of switch elements may be included in one switch circuit, it is desirable that the number of switch elements is the same and the on-resistance is the same between the first switch circuit and the second switch circuit that are provided with respect to the same resistor. With this, the on-resistance of the switch circuit included in the current path of the variable resistance circuit 80 can be made equal regardless of which of the first and second switch circuits is turned on. Note that the on-resistances being the same means that the switch circuits have sufficiently the same on-resistance in order to achieve the advantage of the invention.

The control signal SEL1 for selecting the resistor R1 is supplied to gates of the transistors QN11 and QP21. Also, the inverter 81 inverts the control signal SEL1 and supplies an inverted control signal XSEL1 to gates of the transistors QN21 and QP11.

With this, when the control signal SEL1 for selecting the resistor R1 is activated to a high level, the transistors QN11 and QP11 are turned on and the transistors QN21 and QP21 are turned off, and the resistor R1 is included in the current path of the variable resistance circuit 80. On the other hand, when the control signal SEL1 for selecting the resistor R1 is deactivated to a low level, the transistors QN11 and QP11 are turned off and the transistors QN21 and QP21 are turned on, and the resistor R1 is bypassed.

Here, the on-resistance of each switch circuit can be reduced by adjusting the capability balance between the N-channel MOS transistor and the P-channel MOS transistor that constitute the switch circuit or increasing the sizes thereof. Also, the on-resistance of the switch circuit can be reduced by increasing the gate-source voltages of the N-channel MOS transistor and the P-channel MOS transistor.

With reference to FIG. 11 again, the first and second switch circuits may be provided for each of the plurality of resistors included in the ladder resistor circuit. In this case, the variable resistance circuit 80 includes a plurality of first switch circuits SW11 to SW14, a plurality of second switch circuits SW21 to SW24, and inverters 81 to 84 that are respectively associated with the resistors R1 to R4, and the number of first switch circuits SW11 to SW14 is the same as the number of second switch circuits SW21 to SW24. With this, a configuration can be realized in which, even if the current path of the variable resistance circuit 80 is switched, the number of switch circuits included in the current path is the same, and the total value of the on-resistance is approximately the same, and as a result, the change amount of the resistance value of the variable resistance circuit 80 is mainly determined by the selection/unselection of the resistors in the ladder resistor circuit.

Figure 13:
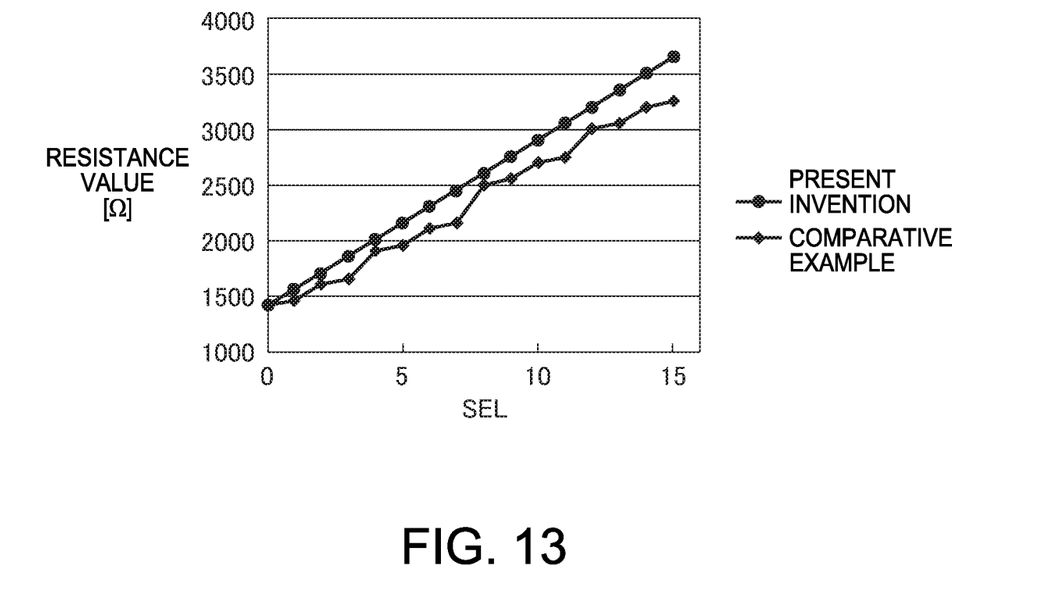
FIG. 13 is a diagram in which resistance values of the variable resistance circuits according to the comparative example and the embodiment are compared.
Figure 14:
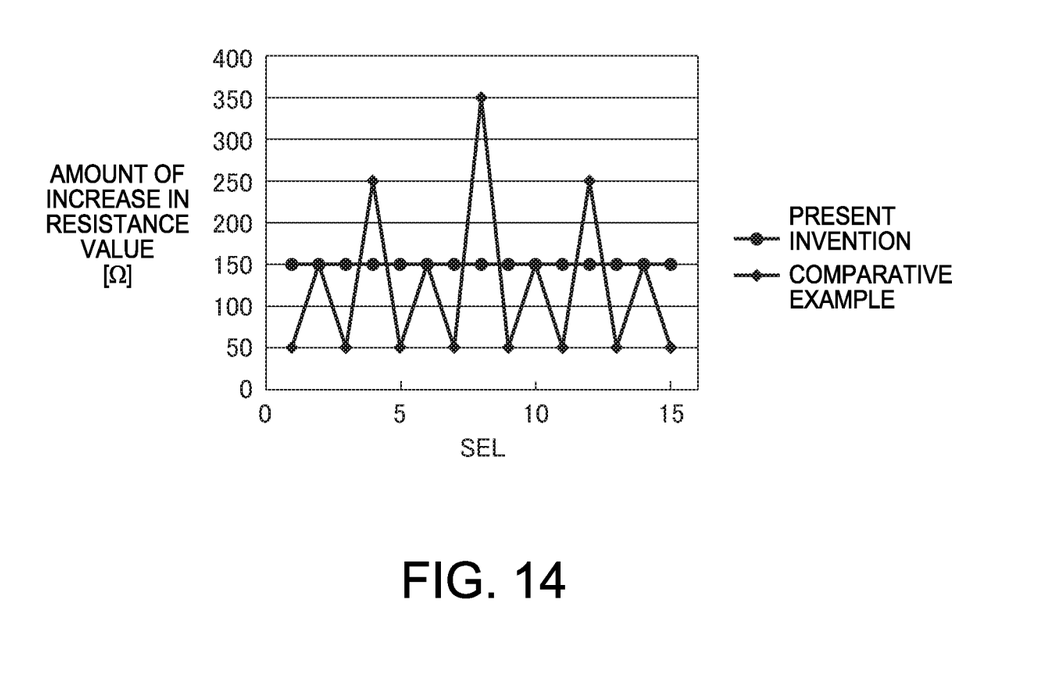
FIG. 14 is a diagram in which amounts of increase in resistance value of the variable resistance circuits according to the comparative example and the embodiment are compared.

FIG. 13 is a diagram in which resistance values of the variable resistance circuits according to the comparative example and the embodiment are compared. FIG. 14 is a diagram in which amounts of increase in resistance value of the variable resistance circuits according to the comparative example and the embodiment are compared. In FIGS. 13 and 14, the horizontal axis shows the control value SEL represented by the four one-bit control signals SEL4 to SEL1. In FIG. 13, the vertical axis shows the resistance value [Ω] of the series circuit of the basic resistor R0 and the variable resistance circuit shown in FIG. 10 or 11. In FIG. 14, the vertical axis shows the amount of increase [Ω] in the resistance value of the variable resistance circuit shown in FIG. 10 or 11.

FIGS. 13 and 14 show simulation results. The conditions of the simulation is that the resistance value of the basic resistor R0 is 1000Ω, the resistance values of the resistors R1 to R4 are respectively 150 Ω, 300 Ω, 600Ω, and 1200Ω, and the on-resistance of each switch circuit is 100Ω.

As shown in FIG. 13, the resistance value of the series circuit of the basic resistor R0 and the variable resistance circuit increases as the control value SEL increases. In the comparative example, since the number of switch circuits included in the current path of the variable resistance circuit changes, the resistance value of the variable resistance circuit does not linearly increase as the control value SEL increases. As shown in FIG. 14, the amount of increase in the resistance value of the variable resistance circuit when the control value SEL increases by "1" varies in a range between 50 Ω to 350Ω.

In contrast, in one embodiment of the invention, since the number of switch circuits included in the current path of the variable resistance circuit 80 is kept constant, the resistance value of the variable resistance circuit 80 linearly increases as the control value SEL increases, as shown in FIG. 13. As shown in FIG. 14, the amount of increase in the resistance value of the variable resistance circuit 80 when the control value SEL increases by "1" is kept constant to 150Ω, and the resistance value of the variable resistance circuit 80 solely depends on the resistance values of the resistors selected in the ladder resistor circuit.

Note that, because four switch circuits having 400Ω of on-resistance in total are inserted in the current path of the variable resistance circuit 80, regardless of whether the second switch circuits SW21 to SW24 are controlled to be turned on or turned off, the resistance value of the basic resistor R0 may be set to 600Ω, which is obtained by subtracting 400Ω of on-resistance in total from 1000Ω of the resistance value of the basic resistor R0. In this case, the on-resistances of the switch circuits need not to be taken into consideration when the oscillator circuit is designed.

Modification of Variable Resistance Circuit

Figure 15:
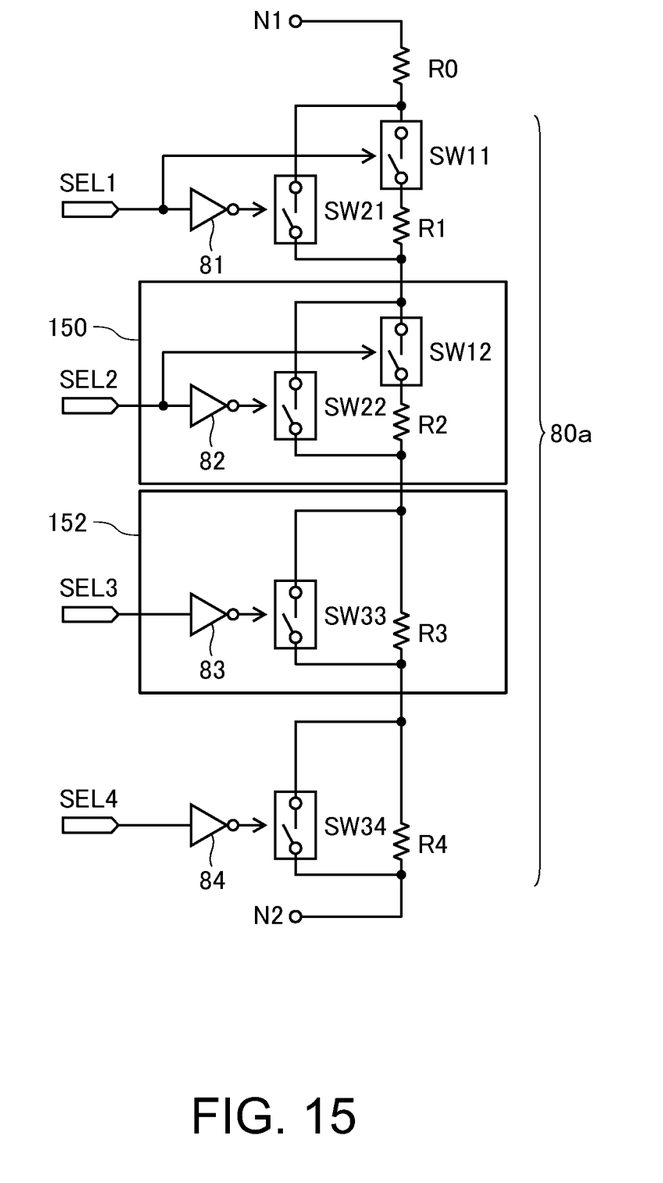
FIG. 15 is a circuit diagram illustrating a configuration of a modification of the variable resistance circuit according to one embodiment of the invention.

FIG. 15 is a circuit diagram illustrating a configuration of a modification of the variable resistance circuit according to one embodiment of the invention. In a variable resistance circuit 80a shown in FIG. 15, the resistance values of the resistors R1 to R4 are assumed to be respectively 150 Ω, 300 Ω, 600Ω, and 1200Ω. If the on-resistance of each switch circuit is assumed to be 100Ω, because the resistance value of the resistor R3 or R4 is sufficiently large relative to 100Ω, even if the first switch circuit connected in series to the resistor R3 or R4 is omitted, the change rate of the resistance value of the variable resistance circuit 80a is not largely affected. Each resistor R1-R4 and its associated circuitry (i.e. switch circuits and inverters) can be considered a resistance sub-circuit. Du to the differences in configuration between the R1/R2 resistance sub-circuits and the R3/R4 resistance sub circuits (described below) the R1/R2 resistance sub-circuits are first resistance sub-circuits 150 and the R3/R4 resistance sub-circuits are second resistance sub-circuits 152.

Therefore, the variable resistance circuit 80a includes a ladder resistor circuit including a plurality of resistors R1 to R4, a first switch circuit (first switch circuit SW11, for example) connected in series to one end of one resistor (resistor R1, for example), of the resistors R1 to R4, a second switch circuit (second switch circuit SW21, for example) connected in parallel to a series circuit of the resistor (resistor R1) and the first switch circuit (first switch circuit SW11), and a third switch circuit (third switch circuit SW33, for example) connected in parallel to a resistor (resistor R3, for example), of the resistors R1 to R4, that is not connected to a first switch circuit. Here, when one of the first and second switch circuits SW11 and SW21 is turned on, the other of the first and second switch circuits SW11 and SW21 is turned off.

Furthermore, the variable resistance circuit 80a may further include a first switch circuit SW12 connected in series to one end of the resistor R2, a second switch circuit SW22 connected in parallel to a series circuit of the resistor R2 and the first switch circuit SW12, and a third switch circuit SW34 connected in parallel to the resistor R4. Here, when one of the first and second switch circuits SW12 and SW22 is turned on, the other of the first and second switch circuits SW12 and SW22 is turned off.

According to the modification shown in FIG. 15, as a result of providing the third switch circuit instead of the first and second switch circuits in some units in the variable resistance circuit 80 shown in FIG. 11, the number of switch circuits in the variable resistance circuit 80 can be reduced, and the circuit area can be reduced.

Here, the first switch circuits SW11 and SW12, the second switch circuits SW21 and SW22, and the third switch circuits SW33 and SW34 may each include the same number of switch elements. Furthermore, it is desirable that the first switch circuits SW11 and SW12, the second switch circuits SW21 and SW22, and the third switch circuits SW33 and SW34 each have the same on-resistance.

Accordingly, a configuration can be realized in which, in the unit in which the first and second switch circuits SW11 and SW21 are provided, for example, the on-resistance of the switch circuit included in the current path of the variable resistance circuit 80 does not noticeably change regardless of whether the first switch circuit SW11 is turned on or the second switch circuit SW21 is turned on.

Also, if the resistance value of the resistor R3 or R4 in a unit in which the third switch circuit SW33 or SW34 is provided is larger than the resistance value of the resistor R1 or R2 in another unit, the error in the change rate of the resistance value of the variable resistance circuit 80 due to the on-resistance of the third switch circuit SW33 or SW34 can be suppressed to be in a certain range.

The invention is not limited to the embodiments described above, and many modifications can be made within the scope of technical idea of the invention by a person having ordinary skill in the art.

What is claimed is:

1. A variable resistance circuit comprising:
    a first resistance sub-circuit having:
        a first resistor;
        a first switch circuit connected in series to one end of the first resistor; and
        a second switch circuit connected in parallel to a series circuit of the first resistor and the first switch circuit; and
    a second resistance sub-circuit connected in series with the first resistance sub-circuit, the second resistance sub-circuit having:
        a second resistor; and
        a third switch circuit connected in parallel to the second resistor,
    wherein, when one of the first and second switch circuits is turned on, the other of the first and second switch circuits is turned off, the first and second resistance sub-circuits form a ladder resistor circuit, and a switch circuit connected in series with the second resistor is not provided in the second resistance sub-circuit.

2. The variable resistance circuit according to claim 1, further comprising:
    an additional first resistance sub-circuit in the ladder resistor circuit.

3. The variable resistance circuit according to claim 1, wherein the first switch circuit, the second switch circuit, and the third switch circuit each include a same number of switch elements.

4. The variable resistance circuit according to claim 1, wherein the first switch circuit, the second switch circuit, and the third switch circuit each has a same on-resistance.

5. An oscillator circuit comprising:
a charging and discharging type oscillator configured to perform an oscillation operation at an oscillation frequency according to the amount of a control current; and
a control current generation unit that includes the variable resistance circuit according to claim 1, and is configured to generate the control current based on an output voltage of a temperature sensor using a resistance value of the variable resistance circuit that is set by a control signal.

6. An oscillator circuit comprising:
a charging and discharging type oscillator configured to perform an oscillation operation at an oscillation frequency according to the amount of a control current; and
a control current generation unit that includes the variable resistance circuit according to claim 2, and is configured to generate the control current based on an output voltage of a temperature sensor using a resistance value of the variable resistance circuit that is set by a control signal.

7. An oscillator circuit comprising:
a charging and discharging type oscillator configured to perform an oscillation operation at an oscillation frequency according to the amount of a control current; and
a control current generation unit that includes the variable resistance circuit according to claim 3, and is configured to generate the control current based on an output voltage of a temperature sensor using a resistance value of the variable resistance circuit that is set by a control signal.

8. An oscillator circuit comprising:
a charging and discharging type oscillator configured to perform an oscillation operation at an oscillation frequency according to the amount of a control current; and
a control current generation unit that includes the variable resistance circuit according to claim 4, and is configured to generate the control current based on an output voltage of a temperature sensor using sensor using a resistance value of the variable resistance circuit that is set by a control signal.

9. A semiconductor device comprising the variable resistance circuit according to claim 1.

10. A semiconductor device comprising the variable resistance circuit according to claim 2.

11. A semiconductor device comprising the variable resistance circuit according to claim 3.

12. A semiconductor device comprising the variable resistance circuit according to claim 4.

* * * * *